United States Patent [19]

Grilletto et al.

[11] Patent Number: 5,597,412
[45] Date of Patent: Jan. 28, 1997

[54] APPARATUS FOR FORCING PLATING SOLUTION INTO VIA OPENINGS

[75] Inventors: Carlo Grilletto, San Carlos; David G. Love, Pleasanton, both of Calif.

[73] Assignee: Fujitsu Limited, Japan

[21] Appl. No.: 388,998

[22] Filed: Feb. 15, 1995

[51] Int. Cl.$^6$ .................................................. C23C 18/00
[52] U.S. Cl. ........................... 118/50; 118/407; 118/429
[58] Field of Search .............................. 118/50, 407, 429; 205/126, 163, 157, 167, 187; 427/97, 98, 238, 294, 296

[56] References Cited

U.S. PATENT DOCUMENTS

| | | | |
|---|---|---|---|
| 3,536,594 | 10/1970 | Pritchard | 204/27 |
| 3,798,136 | 3/1974 | Olsen et al. | 204/15 |
| 3,842,796 | 10/1974 | Hilditch et al. | 118/429 |
| 4,013,809 | 3/1977 | Marocco | 118/50 |
| 4,144,836 | 3/1979 | Bernath | 118/50 |
| 4,193,847 | 3/1980 | Bloom et al. | 204/15 |
| 4,204,918 | 5/1980 | McIntyre et al. | 204/24 |
| 4,311,735 | 1/1982 | Young | 118/50 |
| 4,445,978 | 5/1984 | Whartenby et al. | 204/15 |
| 4,452,170 | 6/1984 | Omata | 118/50 |
| 4,454,009 | 6/1984 | Cockeram et al. | 204/15 |
| 4,466,864 | 8/1984 | Bacon et al. | 204/15 |
| 4,478,882 | 10/1984 | Roberto | 427/97 |
| 4,483,749 | 11/1984 | Shimamura | 204/15 |
| 4,637,952 | 1/1987 | Rosenlund | 427/297 |
| 5,133,995 | 7/1992 | Do et al. | 427/294 |

FOREIGN PATENT DOCUMENTS

| | | | |
|---|---|---|---|
| 6184759 | 7/1994 | Japan | 118/407 |
| 1426659 | 9/1988 | U.S.S.R. | 118/407 |
| 8404705 | 12/1984 | WIPO | 118/407 |

Primary Examiner—Laura Edwards
Attorney, Agent, or Firm—Coudert Brothers

[57] ABSTRACT

A method and apparatus for filling small diameter, high aspect ratio via openings with a plating solution are disclosed. An apparatus according to the invention comprises a sealable chamber for receiving one or more a multichip module substrate comprising via openings to be plated. A vacuum pump is used to evacuate the chamber after the substrate(s) are positioned therein and the chamber has been sealed. Plating solution is then introduced into the chamber to immerse the substrate(s), and the solution is pressurized, forcing the liquid into the via openings. In one preferred embodiment, the chamber comprises two subchambers separated by a flexible wall. After the subchamber holding the substrate(s) has been evacuated and filled with plating solution, the other subchamber is pressurized, as with compressed air, such that a force is applied to the flexible wall creating hydrostatic pressure within the first subchamber.

2 Claims, 2 Drawing Sheets

APPARATUS FOR FORCING PLATING SOLUTION INTO VIA OPENINGS

FIELD OF THE INVENTION

This invention is related to the field of methods and apparatus for fabricating electronic substrates, and is particularly related to the field of forming small-diameter, high aspect ratio vias by plating.

BACKGROUND OF THE INVENTION

The device density of semiconductor integrated circuit chips ("IC" chips) has dramatically increased in the years since their initial introduction, such that millions of discrete components are now routinely included on a single IC chip. In addition, the clock speeds at which such chips operate has dramatically increased, such that digital signals at microwave frequencies are now being used in high performance systems. The increasing complexity of the devices being used, along with the higher speeds of such devices, have challenged the traditional methods of packaging chips.

Various multichip module structures have been developed to address the need to provide improved packaging for modern high-performance IC chips. One important reason for using multichip modules is to minimize signal propagation delay thereby improving system performance. Multichip module structures involve mounting a plurality of IC chips on one or more substrates to form a two- or three-dimensional array of chips. A substrate of a multichip module may include means for delivering power and ground to the individual chips mounted on the substrate, as well as signal paths for interconnecting the chips on the module, and for interconnecting these chips with other devices that are external to the module. Due to the complexity of providing all of the foregoing to each of the chips mounted on a substrate, such substrates are often fabricated as multilayer structures, with various patterned conductive layers being used for the required voltages and ground connections, and other conductive layers being used for signal lines. Interleaved between the patterned conductive layers are insulation layers to prevent shorting between the conductive layers.

Initially, the primary technology for forming multilayered multi-chip module substrates was ceramic-based, (sometimes referred to as "co-fired" ceramic). More recently, thin film structures, primarily based on the use of copper and polyimide, have become important due to the smaller line widths and layer thicknesses that can be realized, as well as the fact that polyimide has a more favorable dielectric constant than most ceramics. In addition, copper/polyimide structures are readily grown on silicon wafers, such that the much of the equipment and some of the techniques used in connection with the processing of semiconductor wafers can be employed in the fabrication of thin film multichip module substrates. Other multichip modules have been developed wherein the two technologies have been combined in multilayered structures comprising both ceramic portions and copper/polyimide portions.

Multilayered multichip module substrates, as just described, require means for connecting the various signal lines, power lines, ground lines and capacitors to a surface of the substrate so that they can be coupled to the IC chips mounted on the module. Such connections between the various layers and the surface of the module are commonly made using "vias" that run from the various layers to the surface or within the structure to interconnect layers.

A via typically comprises an aperture formed through one or more insulating layers as by removal of some of the material of the layer(s), which is then filled with a conductive material. Thus, a via has upper and lower ends at either side of the layer(s) through which it extends and is able to conduct electricity between these ends. The term via is sometimes used in the art to refer only to the aperture that is formed through one or more layers, with the understanding that the aperture is later to be filled with a conductive material. The particular usage of the word is generally obvious from the context, and both usages are employed in this specification. It is also common to speak of a "via opening" to describe the intermediate state of via fabrication after the aperture has been formed but before it is filled or lined with conductive material.

As discussed, one of the reasons for using multichip modules is due to the high number of interconnections that must be made with highly complex IC chips. When a large number of complex chips must be interconnected, the architecture of the multilayered chip module is commensurately complex. The need to provide separate vertical pathways through multiple layers of material presents designers with difficult topographical problems compounding the complexity of the structure. Area or "real estate" on the surface and within the layers of the module is at premium, such that it is desirable to form vias which occupy the minimum amount of area as possible. To do this it is desirable to form vias having a very high aspect ratio, i.e., the ratio of via depth to average via width or diameter.

Various methods are known in the prior art for forming via openings in multichip modules. In ceramic structures where the dimensions are relatively large, holes may simply be punched or otherwise mechanically formed in the various ceramic green sheet layers before they are hardened. Laser drilling of via openings is sometimes used for forming vias in both ceramic and thin film structures. Finally, wet and dry etching techniques may be used, and are particularly common for forming via openings in polyimide. It is noted that in many, if not most, uses of vias in multichip module substrates, the via openings are "blind," i.e., there is only an opening at one end. Vias are typically cylindrical in shape and have an aspect ratio which is defined by the diameter and the depth or height of the via. The present invention is particularly useful with vias wherein the diameter of the opening is less than 40 microns and the aspect ratio is 3:1 or greater.

Once via openings have been formed, they are then filled with a conductive material, typically a metal, which is compatible with the other materials used in the substrate. In the relatively very large via openings used ceramic substrate technology, the via openings in the ceramic green sheet layers are often simply mechanically filled with a conductive paste which hardens when the structure is fired. At the other size extreme, in actual IC chips, where via openings may be less than 0.5 microns in diameter, sputtering and chemical vapor deposition ("CVD") are typically used to fill via openings. However, plating, both electrolytic and electroless, is a preferred technology for filling via openings in thin film (e.g., copper/polyimide) substrates, due to its ability to rapidly deposit material and relative low cost of processing.

As the size has decreased due to the complexity of multichip module substrates and the "cost" of substrate real estate the ease of plating has commensurately decreased. In order to fill a via opening with a solid mass of conductive material by plating, it is necessary to first completely fill the opening with the plating solution. However, liquid surface tension and entrapped air within a via opening makes it difficult to ensure that the via opening to be plated becomes completely filled with plating solution. In addition, the surface characteristics of the via walls, such as its wetability, can impede filling the vias. If, for example, an air bubble is trapped in a via opening during plating, the result might be either the complete failure to grow the necessary mass of conductive material, or growth of a via with a void which has unacceptably poor conductivity.

There are several known prior art techniques to mitigate the foregoing problem, although all of them have limitations. One technique has been to add a surfactant to the plating solution to reduce its surface tension, thereby allowing it to more easier enter, "wet" and fill via openings. However, it is generally undesirable to add unnecessary and potentially contaminating chemicals to the plating mixture. Others techniques include vibrating the substrate to loosen any entrapped air bubbles and the use of a jet of liquid under pressure to force the plating liquid into the via openings. While these techniques have improved the ability to reliably plate small, blind vias, they are only partial solutions to the problem and there remains a need to improve the ability to plate within small, high aspect ratio via openings.

Accordingly, it is an object of the present invention to provide a reliable method of filling small, high aspect ratio via openings in a multichip module subject with a plating solution such that vias may be reliably formed within the substrate.

It is another object of the present invention to provide an apparatus in which the method of the present invention can be employed.

It is still a further object of the present invention to provide a reliable, relatively low-cost, effective method and apparatus for filling via openings with a plating solution or other liquid used in connection with a plating process.

SUMMARY OF THE INVENTION

These and other objects of the present invention, which will be apparent to those skilled in the art upon reading this specification in conjunction with the related drawings and the attached claims, are realized in a method and apparatus for forcing a plating solution, or other solution used in conjunction with a plating process, into small-diameter, high aspect ratio via openings. A method according to the present invention comprises placing a substrate having a via opening into an enclosed chamber, evacuating the chamber such that substantially all of the gas within the via opening is extracted and introducing the desired solution into the chamber such that the evacuated via opening becomes immersed in said solution. Preferably, the method further includes the step of applying pressure to the liquid that has been introduced into the chamber to force it into the opening. An apparatus according to the present invention comprises a sealable chamber for holding a generally flat substrate having a via opening therein, a vacuum pump in fluid communication with said sealable chamber for evacuating the chamber after a substrate has been introduced therein, and means for introducing a liquid used in connection with a plating process into the chamber while the chamber is sealed such that the via opening is immersed in said liquid. In addition, the apparatus may further include means for applying pressure to said liquid to force the liquid into the via opening. In one embodiment, the chamber includes two subchambers separated by a flexible wall. After the first subchamber is evacuated and filled with the desired solution, pressure is applied to the flexible wall, as by pressurizing the second subchamber with a fluid such as air.

DETAILED DESCRIPTION

Figure 1:
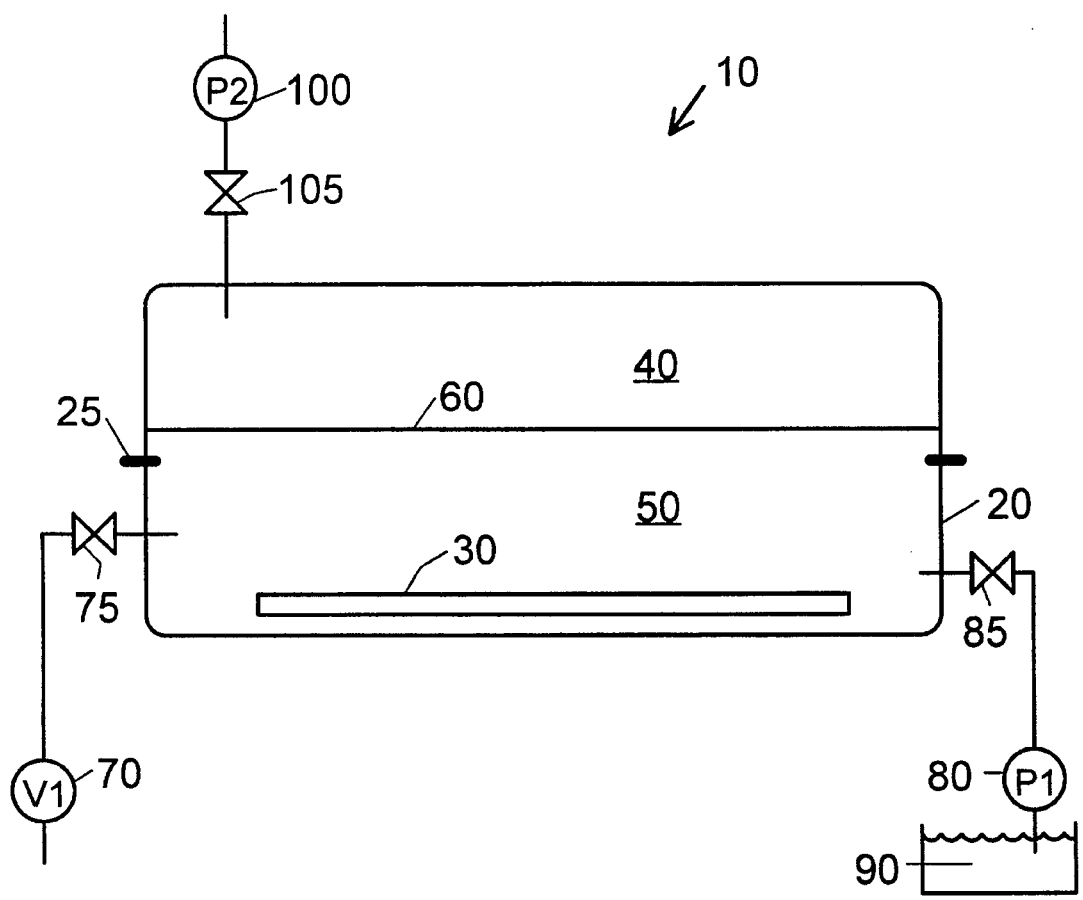
FIG. 1 is a partially schematic, cross-sectional view of an apparatus according to the present invention.

Turning first to FIG. 1, a partially schematic, cross-sectional view of an apparatus 10 according to the present invention shown. The apparatus comprises a sealable chamber 20, in which a multichip module substrate 30 has been positioned. Chamber 20 is sealed and unsealed using flange 25, containing an O-ring, (not shown), in a conventional manner that is well known in the art and need not be described in further detail. When flange 25 is unsealed, the chamber may be opened for the insertion or removal of a one or more multichip module substrates 30. Those skilled in the art will recognize that more sophisticated designs may equivalently be employed, such as a chamber having a vacuum-tight door and an automated substrate handling subsystem for inserting and removing substrates from chamber 20.

Chamber 20 is divided into upper and lower sealable subchambers 40 and 50, respectively, which are separated by a flexible wall 60. Although flexible wall 60 is shown extending across all of chamber 20, the flexible portion of the wall separating subchambers 40 and 50 may only partially span the chamber. Flexible wall 60 may be made out of a thin sheet of stainless steel, nickel, or of an elastomeric material. The material chosen for the construction of flexible wall 60 must, however, be compatible with the chemical properties of the plating solution. The purpose of the flexible wall is to serve as a means of transmitting pressure to the lower chamber when it is filled with a plating solution, as described below. When lower subchamber 50 is filled with a liquid, pressure on flexible wall 60 creates corresponding hydrostatic pressure in the liquid.

As shown, a vacuum pump (V1) 70 is in fluid communication with lower subchamber 50 so that it may be evacuated after multichip module substrate(s) have been inserted therein and the chamber is sealed. Valve 75 is used to isolate the chamber from the vacuum pump, and is closed after evacuation of the chamber is complete. In accordance with the present invention, only a rough vacuum is required and, accordingly, vacuum pump 70 need only be a mechanical roughing pump.

After subchamber 50 has been evacuated and valve 75 closed, plating solution 90 is introduced into subchamber 50. In one embodiment plating solution 90 is introduced using liquid pump (P1) 80 which is in fluid communication with subchamber 50. Valve 85 is located within the fluid line from pump 80 and is shut, for example, while subchamber 50 is being evacuated. Those skilled in the art will recognize that other, equivalent, means of introducing a plating solution, or other liquid used in the plating process, into chamber 20. For example, in a rudimentary embodiment, the lower subchamber may be filled with liquid using a gravity feed. Preferably, the solution that is introduced completely fills subchamber 50. At a minimum, the vias in substrate 30 should be totally immersed in the solution.

After the desired quantity of plating solution 90 is introduced into subchamber 50, valve 85 is closed such that the subchamber is completely sealed. Thereafter, a pressurized fluid, such as compressed air, is introduced into upper subchamber 40. In one embodiment, this is accomplished by opening valve 105 and activating air pump (P2) 100. The pressure that develops within upper subchamber 40 is transmitted to lower subchamber 50, generating substantial hydrostatic pressure within the lower subchamber. As described below, this hydrostatic pressure forces plating solution 90 into the via openings in substrate 30.

Figure 2:
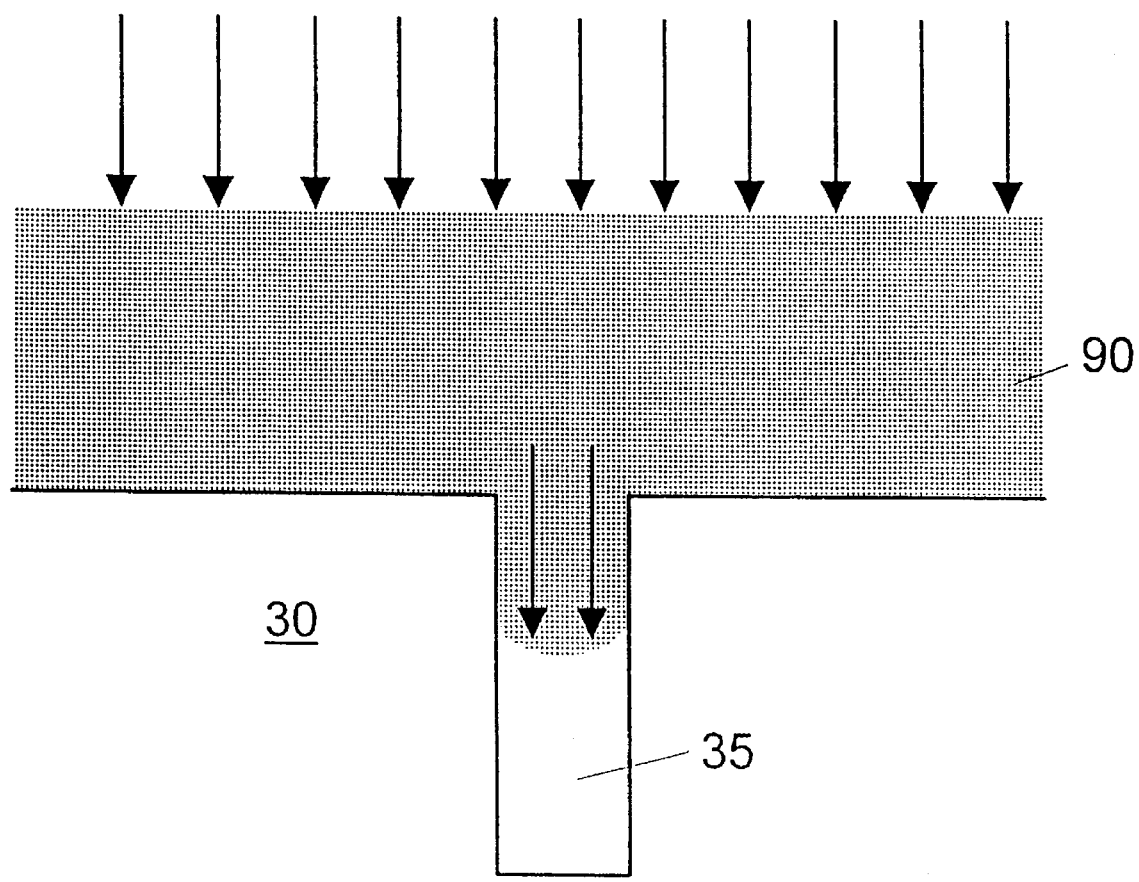
FIG. 2 is a cross-sectional view of a portion multichip module substrate immersed in a plating solution showing the solution entering a via opening.

Turning to FIG. 2, there is shown a portion of a multichip module substrate 30 immersed in plating solution 90. While only one via opening 35 is shown in multichip module substrate 30, an actual multichip module substrate is likely to have a large number of vias that are to be filled with plating solution. The vias may all be substantially identical or they may be quite different. For example, the vias may have different diameter openings and/or different depths such that they have different aspect ratios. The present invention is especially useful with blind high aspect ratio via openings, i.e., openings that have a bottom which prevent fluid from flowing through the via from one end to the other, such as shown in FIG. 2. Such blind vias, which are quite commonly used in microelectronic structures such as multichip module substrates, are particularly apt to trap air bubbles and are otherwise difficult to fill with plating solution. In a state of the art multichip module substrate based on thin-film technology, e.g., made of copper/polyimide, vias may have an entrance opening of 10–40 microns and an aspect ratio of 3:1 or more. A modern multichip module substrate is typically a multilayered structure built up on a base substrate, although for purposes of clarity, the individual layers are not shown in FIG. 2. The individual vias may extend through only a single dielectric layer, or may extend through multiple layers. While the vias openings are usually round, other shapes, such as square openings, are also sometimes used. For purposes of the present invention, the diameter of an opening which is not round should be considered as the average dimension across the entrance to the via.

When it is in an evacuated environment, the air leaves via opening 35 such that it no longer presents an obstacle to the entry of a liquid into the via. In many situations, this is all that is necessary to allow the plating solution to flow into and fill the via openings. Thus, in some circumstances, the method of the present invention will function quite adequately with no additional pressure being applied to the fluid to force it into the openings. However, with some narrow diameter, high aspect ratio vias, the surface tension and viscosity of the liquid will be sufficient to continue to impede the liquid from filling the vias. In addition, when the plating solution, (which typically is primarily water), is introduced into the lower subchamber, a partial pressure of water vapor develops within the chamber and enters the via openings. When this happens, the vias are no longer gas free. Although the vapor pressure is relatively low, it may be sufficiently high to impede filling of the vias. In order to minimize this effect, the liquid introduced into the chamber may be cooled to the lowest feasible temperature in order to minimize its vapor pressure.

The failure to completely fill the via openings 35 with plating solution can lead to the formation of one or more vias that have voids or are otherwise defective. A good via should be a solid mass of conductive material with high conductivity from one end to the other to provide electrical connection between different layers in the substrate. A small number of defective vias, perhaps even one, could render the entire multichip module substrate unusable. Repair of the module, if at all possible, is likely to be expensive and difficult.

Thus, according to the preferred method of the present invention, pressure is applied to plating solution 90 in the lower subchamber 50, to force the plating solution into the via openings. This ensures that each of the via openings is completely filled with the plating solution. As described above in connection with FIG. 1, in one embodiment, hydrostatic pressure is generated by applying pressure to flexible wall 60 that separates the lower and upper subchambers. The liquid pressure forcing the liquid into via opening 35 is symbolically shown by the arrows in FIG. 2. In alternate embodiments, pressure can be generated against wall 60 in upper subchamber 40 by mechanical or electromechanical means, or by coupling a source of compressed air or other gas to valve 105 in lieu of a pump. Likewise, a single chamber can be used and hydrostatic pressure generated in plating solution 90 by use of pump 80. Other equivalent means will be apparent to those skilled in the art.

After the vias in substrate 30 have been filled with plating solution, the substrate can be transferred in a wet state, to a conventional plating tank for the plating process. Alternatively, plating can be performed in situ in chamber 20. In situ plating is particularly appropriate for electroless plating where it is not necessary to incorporate the hardware required to make the electrical connections used in electroplating.

In some instances, better, more reliable plating can be achieved if the walls and bottom of the via opening are first treated or activated. For example, in some instances it is possible to increase the wetability of the surfaces of the via opening by acid treatment. Accordingly, the present invention is also useful in connection to fill a via opening with a solution, such as an acid, which is used in connection with a plating process to pretreat the walls of the via prior to filling them with plating solution.

While the present invention has been particularly described with respect to preferred embodiments, it will be appreciated that various alterations, modifications, and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, to the contrary, is intended to cover various modifications and equivalents that are within the scope of the appended claims.

What is claimed is:

1. Apparatus for forcing a liquid into a high aspect ratio opening in a generally flat substrate, comprising:

a sealable chamber for holding said substrate, said chamber having a wall comprising a flexible diaphragm, a vacuum pump in fluid communication with said sealable chamber, means for introducing said liquid into said chamber while said chamber is sealed, such that said opening in said substrate is immersed in said liquid, and means to exert pressure against said flexible diaphragm such that hydrostatic pressure is created within said liquid.

2. The apparatus of claim 1 wherein said sealable chamber has a first sealable subchamber for receiving said substrate and said liquid and a second sealable subchamber, said first and second subchambers being separated by a common wall comprising said diaphragm and further comprising means for introducing a fluid under pressure into said second chamber to exert pressure against said flexible diaphragm.

* * * * *